US008732565B2

(12) United States Patent
Pisek et al.

(10) Patent No.: US 8,732,565 B2
(45) Date of Patent: May 20, 2014

(54) METHOD AND APPARATUS FOR PARALLEL PROCESSING IN A GIGABIT LDPC DECODER

(75) Inventors: Eran Pisek, Plano, TX (US); Shadi Abu-Surra, Richardson, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 292 days.

(21) Appl. No.: 13/159,091

(22) Filed: Jun. 13, 2011

(65) Prior Publication Data

US 2011/0307760 A1  Dec. 15, 2011

Related U.S. Application Data

(60) Provisional application No. 61/354,614, filed on Jun. 14, 2010.

(51) Int. Cl.
 G06F 11/00 (2006.01)
 H03M 13/00 (2006.01)

(52) U.S. Cl.
 USPC ............................ 714/804; 714/757; 714/758

(58) Field of Classification Search
 None
 See application file for complete search history.

(56) References Cited

U.S. PATENT DOCUMENTS

| 5,583,500 | A  | 12/1996 | Allen et al. |
| 6,854,082 | B1 | 2/2005  | Rhee |
| 7,334,181 | B2 | 2/2008  | Eroz et al. |
| 7,343,539 | B2 | 3/2008  | Divsalar et al. |
| 7,480,845 | B2 | 1/2009  | Kim et al. |
| 7,499,490 | B2 | 3/2009  | Divsalar et al. |
| 7,734,988 | B2 | 6/2010  | Kim et al. |
| 7,890,844 | B2 | 2/2011  | Jeong et al. |
| 7,966,548 | B2 | 6/2011  | Jacobsen et al. |
| 7,984,368 | B2 | 7/2011  | Pisek et al. |
| 8,006,162 | B2 | 8/2011  | Choi et al. |
| 8,117,523 | B2 | 2/2012  | Divsalar et al. |
| 8,132,072 | B2 | 3/2012  | El-Khamy et al. |
| 8,161,363 | B2 | 4/2012  | Jeong et al. |
| 8,209,592 | B2 | 6/2012  | Pisek et al. |

(Continued)

FOREIGN PATENT DOCUMENTS

| KR | 1020070035283 A | 3/2007 |
| KR | 1020090093763 A | 9/2009 |
| KR | 1020100032346 A | 3/2010 |
| KR | 1020100047155 A | 5/2010 |

OTHER PUBLICATIONS

International Search Report dated May 31, 2011 in connection with International Patent Application No. PCT/KR2010/006362.

(Continued)

Primary Examiner — Daniel McMahon

(57) ABSTRACT

A receiver for use in a wireless communications network capable of decoding encoded transmissions. The receiver comprises receive path circuitry for receiving and downconverting an incoming radio frequency (RF) signal to produce an encoded received signal; and a low-density parity check (LDPC) decoder associated with the receive path circuitry for decoding the encoded received signal. The LDPC decoder further comprises a memory for storing a parity check H matrix comprising R rows and C columns, where each element of the parity check H matrix comprises one of a shift value or a −1 value; and a plurality of processing elements for performing LDPC layered decoding, wherein at least one processing element is operable to process in the same cycle a first row and a second row of the parity check H matrix.

20 Claims, 9 Drawing Sheets

(56) References Cited

U.S. PATENT DOCUMENTS

| | | | |
|---|---|---|---|
| 8,239,746 | B2 | 8/2012 | Divsalar et al. |
| 8,386,906 | B2 * | 2/2013 | Shen et al. .................... 714/801 |
| 2006/0203765 | A1 | 9/2006 | Laroia et al. |
| 2006/0294445 | A1 | 12/2006 | Divsalar et al. |
| 2007/0043998 | A1 | 2/2007 | Lakkis |
| 2007/0094568 | A1 | 4/2007 | Choi et al. |
| 2007/0162815 | A1 | 7/2007 | El-Khamy et al. |
| 2008/0126916 | A1 | 5/2008 | Chung et al. |
| 2008/0178065 | A1 | 7/2008 | Khandekar et al. |
| 2009/0013239 | A1 | 1/2009 | Blanksby |
| 2009/0063933 | A1 | 3/2009 | Richardson et al. |
| 2009/0070659 | A1 | 3/2009 | Zhong et al. |
| 2009/0300461 | A1 | 12/2009 | Shor et al. |
| 2010/0098012 | A1 | 4/2010 | Bala et al. |
| 2010/0165931 | A1 | 7/2010 | Nimbalker et al. |
| 2010/0226269 | A1 | 9/2010 | Chakraborty et al. |
| 2011/0047433 | A1 | 2/2011 | Abu-Surra et al. |
| 2011/0066916 | A1 | 3/2011 | Abu-Surra et al. |
| 2011/0110340 | A1 * | 5/2011 | Lakkis ........................ 370/336 |
| 2011/0110457 | A1 * | 5/2011 | Lakkis ........................ 375/295 |
| 2011/0219279 | A1 * | 9/2011 | Abu-Surra et al. ........... 714/746 |
| 2011/0299484 | A1 | 12/2011 | Nam et al. |
| 2012/0084625 | A1 * | 4/2012 | Pisek et al. .................... 714/757 |
| 2012/0240001 | A1 * | 9/2012 | Abu-Surra et al. ........... 714/752 |

OTHER PUBLICATIONS

Written Opinion of the International Searching Authority dated May 31, 2011 in connection with International Patent Application No. PCT/KR2010/006362.

Sunghwan Kim, et al., "Quasi-Cyclic Low-Density Parity-Check Codes With Girth Larger Than 12", IEEE Transactions on Information Theory, vol. 53, No. 8, Aug. 2007, p. 2885-2891.

Eran Sharon, et al., "Generating Good Finite Length LDPC Codes Based on Lifted Graphs", Forty-Fourth Annual Allerton Conference, Sep. 27-29, 2006, p. 41-50.

Gianluigi Liva, et al., "Design of LDPC Codes: A Survey and New Results", J. Comm. Software and Systems, Sep. 2006, 22 pages.

N. Jacobsen, et al., "Design of rate-compatible irregular LDPC codes based on edge growth and parity splitting", in Proc. IEEE Vehicular Technology Conference (VTC); 30 2007; Oct. 3, 2007, p. 1052-1056.

H-G Joo, et al., "New Construction of Rate-Compatible Block-Type Low-Desity Parity-Check Codes Using Splitting", Proc. IEEE (PIMRC 2006), Sep. 2006, 5 pages.

Andrew Blanksby, et al., "LDPC Code Set for mmWave Communication", mmCom '10, Sep. 24, 2010, p. 39-43.

Written Opinion of the International Searching Authority dated Feb. 23, 2012 in connection with International Patent Application No. PCT/KR2011/004051.

International Search Report dated Feb. 23, 2012 in connection with International Patent Application No. PCT/KR2011/004051.

"3rd Generation Partnership Project; Technical Specification Group Radio Access Network; Evolved Universal Terrestrial Radio Access (E-UTRA); Ohysical Channels and Modulation (Release 9)", 3GPP TS 36.211 v9.1.0, Mar. 2010, 85 pages.

Thomas Henige, et al., "High-Throughput Low-Power LDPC Decoder and Code Design", 2011, 6 pages.

Shadi Abu-Surra, et al., "Gigabit Rate Achieving Low-Power LDPC Codes: Design and Architecture", 6 pages.

Notification of Transmittal of the International Search Report and the Written Opinion of the International Searching Authority, or the Declaration dated Feb. 10, 2012 in connection with International Patent Application No. PCT/KR2011/004351.

Office Action dated Oct. 16, 2013 in connection with U.S. Appl. No. 13/248,900.

Office Action dated Nov. 7, 2013 in connection with U.S. Appl. No. 13/115,900.

* cited by examiner

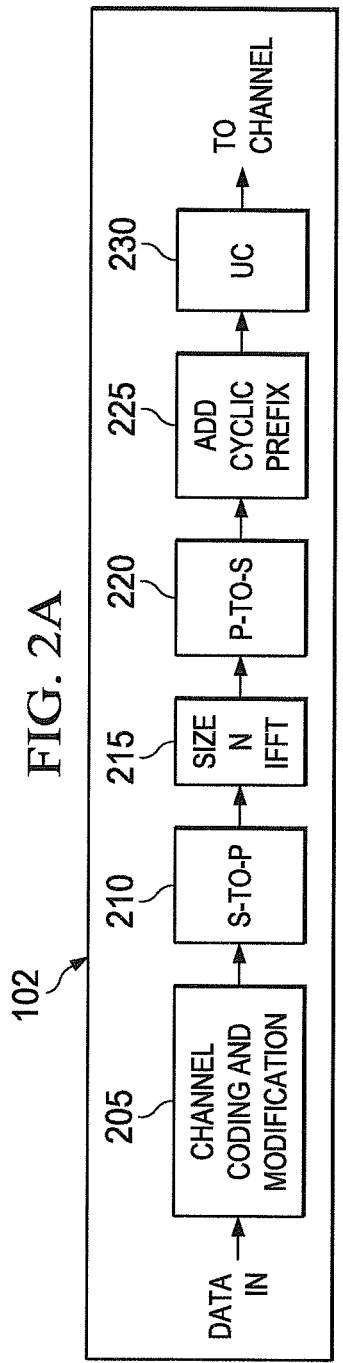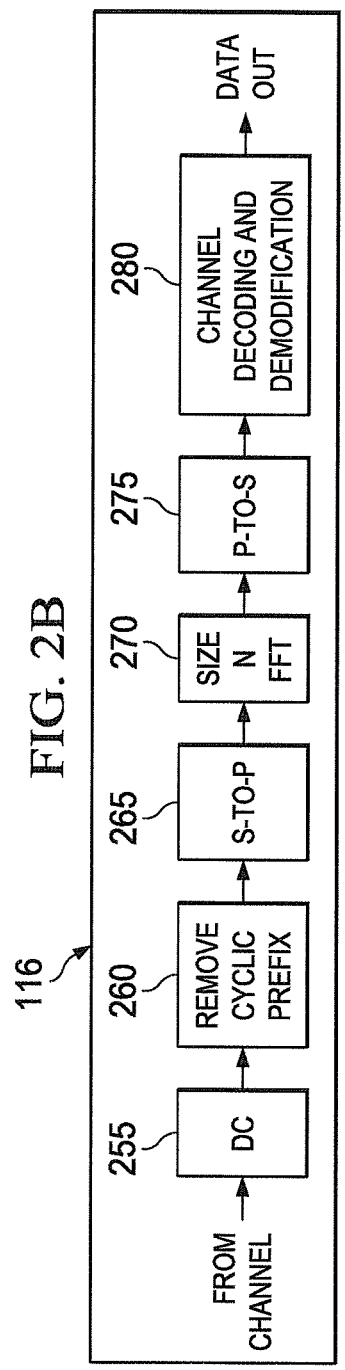

FIG. 5A $$
550 \left\{
\begin{array}{ccccccccccccccccccccc|ccccc}
-1 & 25 & 55 & -1 & 47 & 4 & -1 & 91 & 84 & 8 & 86 & 52 & 82 & 33 & 5 & 0 & 36 & 20 & 4 & 77 & 80 & 0 & -1 & -1 & 0 \\
-1 & 6 & -1 & 36 & 40 & 47 & 12 & 79 & 47 & -1 & 41 & 21 & 12 & 71 & 14 & 72 & 0 & 44 & 49 & 0 & 0 & 0 & 0 & -1 & 0 \\
51 & 81 & 83 & 4 & 67 & -1 & 21 & -1 & 31 & 24 & 91 & 61 & 81 & 9 & 86 & 78 & 60 & 88 & 67 & 15 & -1 & -1 & 0 & 0 & -1 \\
50 & -1 & 50 & 15 & -1 & 36 & 13 & 10 & 11 & 20 & 53 & 90 & 29 & 92 & 57 & 30 & 84 & 92 & 11 & 66 & 80 & -1 & -1 & 0 & 0
\end{array}
\right.
$$

RATE = 5/6 CODE

| LAYERED MACHINE NUMBER AT CYCLIC TIME | FLOODING MACHINE NUMBER | SYSTEMATIC | | | | | | | | PARITY | | | | | | |
|---|---|---|---|---|---|---|---|---|---|---|---|---|---|---|---|---|
| P0/T=0 | P0 | 40 | -1 | 38 | -1 | 13 | -1 | 5 | -1 | 18 | -1 | -1 | -1 | -1 | -1 | -1 |
| P0/T=1 | P1 | 34 | -1 | 35 | -1 | 27 | -1 | -1 | 30 | 2 | 1 | -1 | -1 | -1 | -1 | -1 |
| P0/T=0 | P0 | -1 | 36 | -1 | 31 | -1 | 7 | -1 | 34 | -1 | 10 | 41 | -1 | -1 | -1 | -1 |
| P0/T=1 | P1 | -1 | 27 | -1 | 18 | -1 | 12 | 20 | -1 | -1 | -1 | 15 | 6 | -1 | -1 | -1 |
| P0/T=2 | P2 | 35 | -1 | 41 | -1 | 40 | -1 | 39 | -1 | 28 | -1 | -1 | 3 | 28 | -1 | -1 |
| P0/T=3 | P3 | 29 | -1 | 0 | -1 | -1 | 22 | -1 | 4 | -1 | 28 | -1 | 27 | -1 | 23 | -1 |
| P0/T=2 | P2 | -1 | 31 | -1 | 23 | -1 | 21 | -1 | 20 | -1 | -1 | 12 | -1 | -1 | 0 | 13 |
| P0/T=3 | P3 | -1 | 22 | 1 | 34 | 31 | 1 | 14 | 1 | 4 | 1 | 1 | 1 | 13 | 1 | 22 | 24 |

RATE = 1/2 CODE

FIG. 9

| LAYERED MACHINE NUMBER AT CYCLIC TIME | FLOODING MACHINE NUMBER | SYSTEMATIC | | | | | | | | PARITY | | | | | | |
|---|---|---|---|---|---|---|---|---|---|---|---|---|---|---|---|---|
| P0/T=0 | P0 | 20 | 36 | 34 | 31 | 20 | 7 | 41 | 34 | -1 | 10 | 41 | -1 | -1 | -1 | -1 |
| P0/T=1 | P1 | 30 | 27 | 1 | 18 | 1 | 12 | 20 | 14 | 2 | 25 | 15 | 6 | 1 | 1 | 1 |
| P0/T=2 | P2 | 35 | -1 | 41 | -1 | 40 | -1 | 39 | -1 | 28 | -1 | -1 | 3 | 28 | -1 | -1 |
| P0/T=3 | P3 | 29 | -1 | 0 | -1 | -1 | 22 | -1 | 4 | -1 | 28 | -1 | 27 | 24 | 23 | -1 |
| P0/T=2 | P2 | -1 | 31 | -1 | 23 | -1 | 21 | -1 | 20 | -1 | 9 | 12 | -1 | -1 | 0 | 13 |
| P0/T=3 | P3 | -1 | 22 | 1 | 34 | 31 | -1 | 14 | -1 | 4 | -1 | -1 | -1 | -1 | -1 | 22 | 24 |

RATE = 5/8 CODE

| LAYERED MACHINE NUMBER AT CYCLIC TIME | FLOODING MACHINE NUMBER | SYSTEMATIC | | | | | | | | | | | | PARITY | | |
|---|---|---|---|---|---|---|---|---|---|---|---|---|---|---|---|---|
| P0/T=0 | P0 | 35 | 19 | 41 | 22 | 40 | 41 | 39 | 6 | 28 | 18 | 17 | 3 | 28 | -1 | -1 | -1 |
| P0/T=1 | P1 | 29 | 30 | 0 | 8 | 33 | 22 | 17 | 4 | 27 | 28 | 20 | 27 | 24 | 23 | -1 | -1 |
| P0/T=2 | P2 | 37 | 31 | 18 | 23 | 11 | 21 | 6 | 20 | 32 | 9 | 12 | 29 | -1 | 0 | 13 | -1 |
| P0/T=3 | P3 | 25 | 22 | 4 | 34 | 31 | 3 | 14 | 15 | 4 | -1 | 14 | 18 | 13 | 13 | 22 | 24 |

RATE = 3/4 CODE

FIG. 10

| LAYERED MACHINE NUMBER AT CYCLIC TIME | FLOODING MACHINE NUMBER | SYSTEMATIC | | | | | | | | | | | | PARITY | | |
|---|---|---|---|---|---|---|---|---|---|---|---|---|---|---|---|---|
| P0/T=0 | P0 | 29 | 30 | 0 | 8 | 33 | 22 | 17 | 4 | 27 | 28 | 20 | 27 | 24 | 23 | -1 | -1 |
| P0/T=1 | P1 | 37 | 31 | 18 | 23 | 11 | 21 | 6 | 20 | 32 | 9 | 12 | 29 | 10 | 0 | 13 | -1 |
| P0/T=2 | P2 | 25 | 22 | 4 | 34 | 31 | 3 | 14 | 15 | 4 | 2 | 14 | 18 | 13 | 13 | 22 | 24 |

RATE = 13/16 CODE

FIG. 11

METHOD AND APPARATUS FOR PARALLEL PROCESSING IN A GIGABIT LDPC DECODER

CROSS-REFERENCE TO RELATED APPLICATION(S) AND CLAIM OF PRIORITY

This application is related to U.S. Provisional Patent Application No. 61/354,614, filed Jun. 14, 2010, entitled "Method And Apparatus For Parallel Processing Gigabit LDPC Decoding System". Provisional Patent Application No. 61/354,614 is assigned to the assignee of this application and is hereby incorporated by reference into this application as if fully set forth herein. The present application hereby claims priority under 35 U.S.C. §119(e) to U.S. Provisional Patent Application No. 61/354,614.

The present application is also related to U.S. patent application Ser. No. 12/876,903, filed Sep. 7, 2010, entitled "System and Method For Structured LDPC Code Family" and U.S. patent application Ser. No. 12/855,442, filed Aug. 12, 2010, entitled "System and Method For Structured LDPC Code Family With Fixed Code Length And No Puncturing". U.S. patent application Ser. Nos. 12/876,903 and 12/855,442 are assigned to the assignee of the present application and are hereby incorporated by reference into the present application as if fully set forth herein.

TECHNICAL FIELD OF THE INVENTION

The present application relates generally to wireless communications devices and, more specifically, to encoding and decoding data transmitted between wireless communication devices.

BACKGROUND OF THE INVENTION

In information theory, a low-density parity-check (LDPC) code is an error correcting code for transmitting a message over a noisy transmission channel. LDPC codes are a class of linear block codes. While LDPC and other error correcting codes cannot guarantee perfect transmission, the probability of lost information may be made as small as desired. LDPC was the first code to allow data transmission rates close to the theoretical maximum known as the Shannon Limit. LDPC codes can perform with 0.0045 dB of the Shannon Limit. LDPC was impractical to implement when developed in 1963. Turbo codes, discovered in 1993, became the coding scheme of choice in the late 1990s. Turbo codes are used for applications such as deep-space satellite communications. LDPC requires complex processing but is the most efficient scheme discovered as of 2007. LDPC codes can yield a large minimum distance (hereinafter "$d_{min}$") and reduce decoding complexity.

SUMMARY OF THE INVENTION

A receiver, for use in a wireless communications network, capable of decoding encoded transmissions is provided. The receiver comprises receive path circuitry for receiving and downconverting an incoming radio frequency (RF) signal to produce an encoded received signal; and a low-density parity check (LDPC) decoder associated with the receive path circuitry for decoding the encoded received signal. The LDPC decoder further comprises a memory for storing a parity check H matrix comprising R rows and C columns, where each element of the parity check H matrix comprises one of a shift value or a −1 value; and a plurality of processing elements for performing LDPC layered decoding, wherein at least one processing element is operable to process in the same cycle a first row and a second row of the parity check H matrix.

A method for decoding transmissions in a wireless communications network is provided. The method includes the steps, in a receiving device, receiving and down-converting an incoming radio frequency (RF) signal to produce an encoded received signal; and decoding the encoded received signal in a low-density parity check (LDPC) decoder. The LDPC decoder comprises a memory for storing a parity check H matrix comprising R rows and C columns, where each element of the parity check H matrix comprises one of a shift value or a −1 value. The method further comprises, in a processing element of the decoder operable to perform LDPC layered decoding, processing in the same cycle a first row and a second row of the parity check H matrix.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 2A illustrates a high-level diagram of an orthogonal frequency division multiple access transmit path according to an exemplary embodiment of the disclosure;

FIG. 2B illustrates a high-level diagram of an orthogonal frequency division multiple access receive path according to an exemplary embodiment of the disclosure;

FIG. 5A illustrates a rate 1/2 code according to one embodiment of a conventional LDPC decoder;

FIG. 5B illustrates a rate 5/6 code according to one embodiment of a conventional LDPC decoder;

FIG. 8 depicts an H Matrix for a rate 1/2 code;

FIG. 9 depicts an H Matrix for a rate 5/8 code;

FIG. 10 depicts an H Matrix for a rate 3/4 code; and

FIG. 11 depicts an H Matrix for a rate 13/16 code.

DETAILED DESCRIPTION OF THE INVENTION

Figure 1:
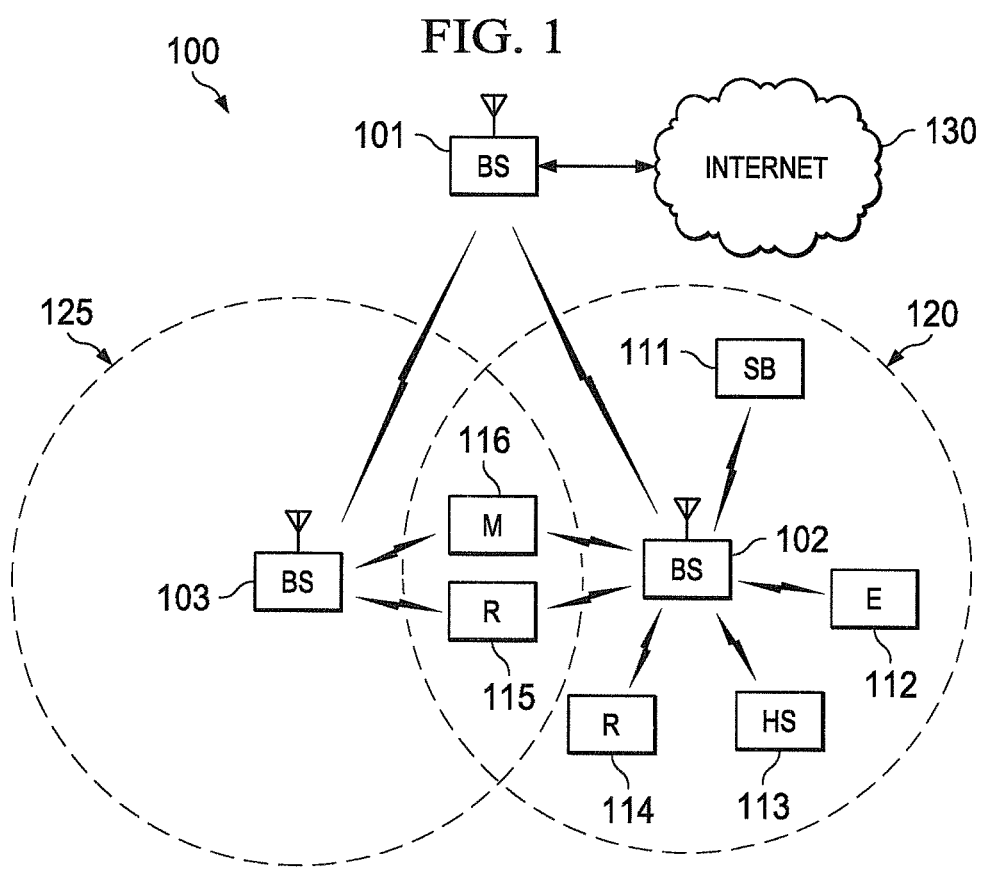
FIG. 1 illustrates an exemplary wireless network 100, which transmits ACK/NACK messages according to an exemplary embodiment of the disclosure.

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless or wireline communication system.

The present disclosure describes an apparatus and method to increase design efficiency for a >1 Gbps LDPC decoder. The proposed architecture supports LDPC H matrix codes for Z=42, as proposed in U.S. patent application Ser. No. 12/876,903, which was previously incorporated by reference above. The proposed architecture also supports LDPC H Matrix codes for z=24, as proposed in U.S. patent application Ser. No. 12/855,442, which was previously incorporated by reference above.

Basically, LDPC decoding methods may be divided into two main categories. A first category, called flooding or parallel decoding ignores row contentions to increase parallelism. A second category, called layered or serial decoding uses the information accumulated between row processing. Layered decoding may require more cycles to process per iteration due to contentions. However, layered decoding requires significantly less iterations (33%-50% less iterations) to converge to the same BLER performance as the flooding decoding.

Prior art solutions for gigabit LDPC decoding mainly considered the flooding decoding method to increase LDPC processing parallelism to meet throughput requirements and ignored any possible contentions between the check nodes. This reduced the processing efficiency and increased the number of required iterations to reach the target FER/BER, which resulted in increased power consumption.

FIG. 8-11 give an example for LDPC decoding of four different rates supported by four different H Matrices, as defined in WiGig/802.11ad, Spec 1.0, with a 672-bit block size. As discussed below in greater detail, FIGS. 8-11 describe how the two decoding methods (layered and flooding) may process the given rate and H Matrix and indicated how many LDPC machines (processing elements) and cycles are required to process the H Matrix. A comparison for processing the related rate is given between the two decoding methods.

In general, the advantages of a flooding decoding architecture for WiGig are: i) high-speed processing (1 iteration/cycle); and ii) low latency (single block processing). The disadvantages of a flooding decoding architecture for WiGig are: i) high power per gate count per throughput; slower convergence (33-50% slower); iii) less efficient (i.e., rate 13/16 case—3 rows and 4 machines); and iv) higher critical path.

In general, the advantages of a layered decoding architecture for WiGig are: i) smaller gate count per throughput (3 machines vs. 4 machines); scalability (ease of synthesis—single machine synthesis); iii) lower critical path (reduced logic, no need to add min values before write back); and iv) allows inter-row early stopping. The disadvantages of a layered decoding architecture for WiGig are: i) 1.5× max latency due to multiple blocks; and ii) bigger buffers to support multiple blocks.

FIG. 1 illustrates an exemplary wireless network 100, which performs LDPC encodings and decoding according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of mobile stations within coverage area 120 of base station 102. The first plurality of mobile stations includes mobile station 111, which may be located in a small business (SB), mobile station 112, which may be located in an enterprise (E), mobile station 113, which may be located in a WiFi hotspot (HS), mobile station 114, which may be located in a first residence (R), mobile station 115, which may be located in a second residence (R), and mobile station 116, which may be a mobile device (M), such as a cell phone, a wireless laptop, a wireless PDA, or the like.

Base station 103 provides wireless broadband access (via base station 101) to Internet 130 to a second plurality of mobile stations within coverage area 125 of base station 103. The second plurality of mobile stations includes mobile station 115 and mobile station 116. In an exemplary embodiment, base stations 101-103 may communicate with each other and with mobile stations 111-116 using OFDM or OFDMA techniques.

Base station 101 may be in communication with either a greater number or a lesser number of base stations. Furthermore, while only six mobile stations are depicted in FIG. 1, it is understood that wireless network 100 may provide wireless broadband access to additional mobile stations. It is noted that mobile station 115 and mobile station 116 are located on the edges of both coverage area 120 and coverage area 125. Mobile station 115 and mobile station 116 each communicate with both base station 102 and base station 103 and may be said to be operating in handoff mode, as known to those of skill in the art.

Mobile stations 111-116 may access voice, data, video, video conferencing, and/or other broadband services via Internet 130. In an exemplary embodiment, one or more of mobile stations 111-116 may be associated with an access point (AP) of a WiFi WLAN. Mobile station 116 may be any of a number of mobile devices, including a wireless-enabled laptop computer, personal data assistant, notebook, handheld device, or other wireless-enabled device. Mobile stations 114 and 115 may be, for example, a wireless-enabled personal computer (PC), a laptop computer, a gateway, or another device.

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in mobile station (MS) 116 for the purposes of illustration and explanation only. However, it will be understood by those skilled in the art that the OFDMA receive path may also be implemented in BS 102 and the OFDMA transmit path may be implemented in MS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in MS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

In BS 102, channel coding and modulation block 205 receives a set of information bits, applies LDPC coding and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and MS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at MS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes (i.e., performs LDPC decoding) the modulated symbols to recover the original input data stream.

Each of base stations 101-103 may implement a transmit path that is analogous to transmitting in the downlink to mobile stations 111-116 and may implement a receive path that is analogous to receiving in the uplink from mobile stations 111-116. Similarly, each one of mobile stations 111-116 may implement a transmit path corresponding to the architecture for transmitting in the uplink to base stations 101-103 and may implement a receive path corresponding to the architecture for receiving in the downlink from base stations 101-103.

The channel decoding and demodulation block 280 decodes the received data. The channel decoding and demodulation block 280 includes a decoder configured to perform a low density parity check decoding operation. In some embodiments, the channel decoding and demodulation block 280 comprises one or more context-based operation reconfigurable instruction set processors (CRISPs), such as the CRISP processor(s) described in one or more of Application Ser. No. 11/123,313, filed May 6, 2005 and entitled "Context-Based Operation Reconfigurable Instruction Set Processor And Method Of Operation"; U.S. Pat. No. 7,769,912, filed Jun. 1, 2005 and entitled "MultiStandard SDR Architecture Using Context-Based Operation Reconfigurable Instruction Set Processors"; U.S. Pat. No. 7,483,933, issued Jan. 27, 2009 and entitled "Correlation Architecture For Use In Software-Defined Radio Systems"; application Ser. No. 11/225,479, filed Sep. 13, 2005 and entitled "Turbo Code Decoder Architecture For Use In Software-Defined Radio Systems"; and application Ser. No. 11/501,577, filed Aug. 9, 2006 and entitled "Multi-Code Correlation Architecture For Use In Software-Defined Radio Systems", all of which are hereby incorporated by reference into the present application as if fully set forth herein.

Figure 3:
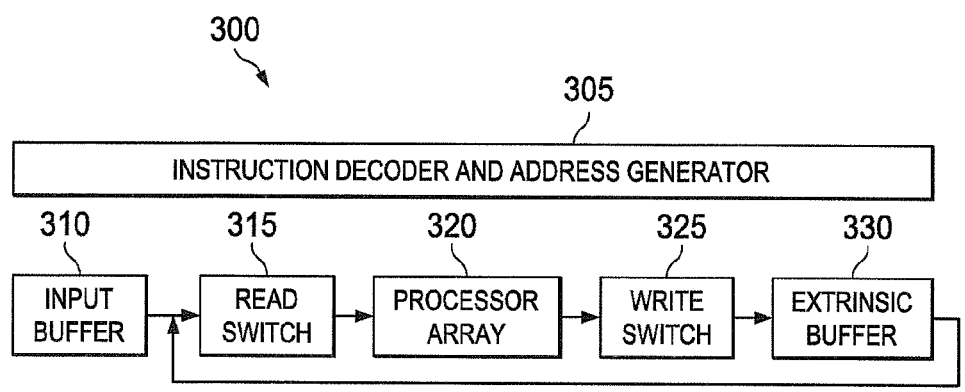
FIG. 3 illustrates a LDPC CRISP top-level architecture according to embodiments of the present disclosure.

FIG. 3 illustrates a top-level architecture of LDPC CRISP 300 according to embodiments of the present disclosure. The embodiment of LDPC CRISP 300 shown in FIG. 3 is for illustration only. Other embodiments of top-level architectures for LDPC CRISP 300 could be used without departing from the scope of this disclosure. LDPC CRISP 300 may be implemented in channel decoding and demodulation block 280 in FIG. 2.

LDPC CRISP 300 includes instruction decoder & address generator block 305. In some embodiments, instruction decoder & address generator block 305 may be a programmable finite state machine. In some embodiments, instruction decoder & address generator block 305 operates as a controller for LDPC CRISP 300 and its components. LDPC CRISP 300 also includes input buffer block 310, read switch block 315, processor array 320, write switch block 325 and extrinsic buffer block 330. In some embodiments (not specifically illustrated), input buffer block 310 includes extrinsic buffer block 330 (e.g., input buffer block 310 and extrinsic buffer 330 may be the same block).

Instruction decoder & address generator block 305 includes a plurality of instructions to control operations of LDPC CRISP 300. In some embodiments, a portion (e.g., some or all) of the plurality of instructions is reconfigurable to vary the operation of LDPC CRISP 300. The plurality of instructions may be reconfigured to have LDPC CRISP 300 perform Serial V decoding or Serial-C decoding. Additionally, the plurality of instructions may be reconfigured to have LDPC CRISP 300 perform decoding by a flooding technique, layered technique, sum products technique, or min-sum technique. The plurality of instructions also may be reconfigured to vary a number of iterations performed such that LDPC CRISP 300 only performs a number of iterations or continues to perform iterations until a specified event occurs or a specified amount of time lapses.

Further, the plurality of instructions may be reconfigured to have LDPC CRISP 300 perform decoding for any one or more of IEEE 802.16e (hereafter, "WiMax"), Digital Video Broadcasting-Satellite-Second Generation (hereafter, "DVB-S2"), and international Mobile Telecommunications-Advanced (hereafter, "IMT-Advanced" or "4G"). LDPC CRISP 300 may be applied to any system that incorporates an LDPC decoding algorithm including, but not limited to, CDMA, OFDMA, WiMax, third generation (3G) and 4G systems. Additionally, the plurality of instructions may be reconfigured to have LDPC CRISP 300 vary the number of LDPC CRISP decoder units for use in the decoding operation.

Instruction decoder & address generator block 305 also is configured to store an H-matrix (discussed below with respect to FIGS. 5A and 5B).

Input buffer block 310 is configured to receive data (e.g., codewords or symbols). Input buffer block 310 includes a number of memory blocks for storing the received data. In some embodiments, input buffer block 310 may includes twenty-four (24) memory blocks for storing the received data.

Read switch reads the H-matrix from instruction decoder & address generator block 305. Read switch 315 also reads the received data from input buffer block 310. Read switch 315 uses the H-matrix to determine from where to read the data from input buffer 310. Read switch 315 is configured to apply a Z-factor right shift multiplexer (MUX) operation to the received data read from input buffer block 310. The Z-factor right shift multiplexor (MUX) operation is based on the shift data computed from the H-matrix or the shift vector (discussed below with respect to FIGS. 5A and 5B).

Processor array 320 includes a number of processor elements. Each processor element (PE) includes a plurality of processors configured to perform a flooding technique, layered technique, sum products technique, or min-sum technique. For example, processor array 320 may be configured to find minimum values using a min-sum technique. Further, processor array 320 is configured to perform decoding for any one or more of WiMax, DVB-S2 and 4G. In some embodiments, processor array 320 includes four (4) processor elements, each processor element including twenty-four (24) processors. In such embodiments, LDPC CRISP 300 may be referenced as a 2/4-unit LDPC decoder CRISP.

Write switch block 325 is configured to receive Min/Next Min selection and sums from processor array 320. Write switch block 325 further is configured to apply a Z-factor left shift MUX operation to the Min/Next Min selection and sums received from processor array 320 to generate a set of output extrinsic data. Further, write switch block 325 is configured to write the output extrinsic data of write switch block 325 to extrinsic buffer block 330. For example, write switch block 325 is configured to use the H-matrix to reverse the operation performed by read switch 315.

Extrinsic buffer block 330 is configured to store the output extrinsic data in a number of memory units. In some embodiments, extrinsic buffer block 330 includes twenty-four (24) memory units. Extrinsic buffer block 330 also is coupled to read switch 315 such that read switch 315 may read the output extrinsic data (hereinafter also "extrinsic output").

Thus, LDPC CRISP 300 is able to perform a number of iterations of the received data. LDPC CRISP 300 is operable to read the input data and apply a decoding process to the input data to output an extrinsic data. Thereafter, LDPC CRISP 300 performs one or more iterations of the decoding process using extrinsic data from the previous decoding process as the input for the next decoding process. As such, the input data is used only once and, thereafter, LDPC CRISP 300 generates the extrinsic data for use in the subsequent iterations.

LDPC CRISP 300 may be configured to perform iterations until a cessation event occurs. For example, LDPC CRISP 300 may be configured to perform a specified number of iterations. Additionally, LDPC CRISP 300 may be configured to perform iterations until the extrinsic data reaches a specified value (e.g., a convergence point). Further, LDPC CRISP 300 may be configured to perform iterations until a most significant bit (MSB) output is unchanged for several consecutive iterations.

LDPC codes are linear codes that may be characterized by sparse parity check matrices (H). The H matrix has a low density of binary 1 bits. The sparseness of H yields a large $d_{min}$ and reduces decoding complexity. An exemplary H-matrix is represented by Equation 1:

$$H = \begin{bmatrix} 1 & 1 & 1 & 1 & 0 & 1 & 0 & 1 & 0 & 1 \\ 1 & 0 & 1 & 1 & 0 & 0 & 1 & 1 & 1 & 1 \\ 0 & 1 & 0 & 1 & 0 & 0 & 0 & 1 & 0 & 0 \\ 1 & 0 & 0 & 0 & 1 & 0 & 1 & 1 & 1 & 1 \\ 0 & 0 & 1 & 1 & 1 & 0 & 1 & 0 & 1 & 0 \end{bmatrix}. \quad \text{[Eqn. 1]}$$

An LDPC code is regular if every row has the same weight, ($W_r$) and every column has the same weight ($W_c$). The regular LDPC code is denoted by ($W_c$, $W_r$)-regular. Otherwise, the LDPC code is irregular. Regular codes are easier to implement and analyze. Furthermore, regular codes have lower error floors. However, irregular codes may get closer to capacity than regular codes.

Figure 4:
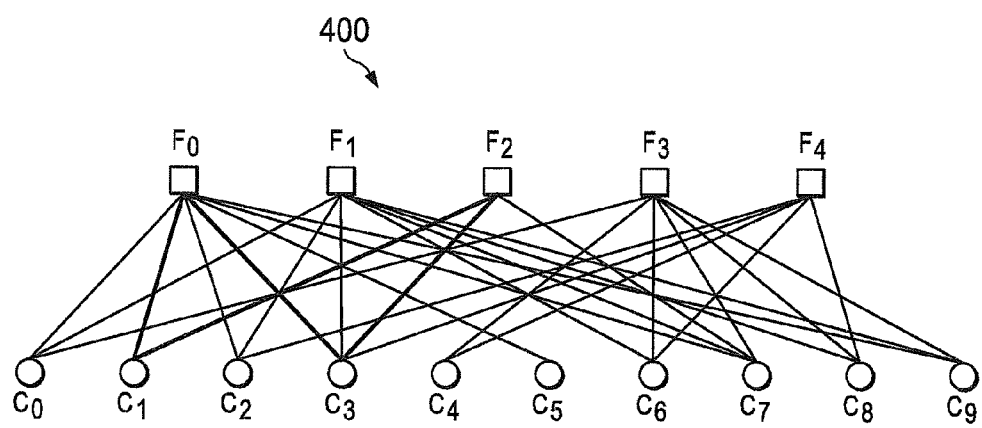
FIG. 4 illustrates a Tanner graph corresponding to a parity check matrix according to embodiments of the present disclosure.

FIG. 4 illustrates Tanner graph 400, which corresponds to a parity check matrix according to embodiments of the present disclosure. The embodiment of Tanner graph 400 shown in FIG. 4 is for illustration only. Other embodiments of Tanner graph 400 may be used without departing from the scope of this disclosure.

Tanner graph 400 is a bipartite graph. In bipartite graphs, nodes are separated into two distinctive sets and edges only connect nodes of two different types. The two types of nodes in Tanner graph 400 are referred to as variable nodes (hereafter, "v-nodes") and check nodes (hereafter, "c-nodes").

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

Tanner graph 400 corresponds to the parity check H-matrix illustrated by Equation 1. Tanner graph 400 includes five (5) c-nodes (the number of parity bits) and ten (10) v-nodes (the number of bits in a codeword). C-node $f_i$ is connected to v-node $c_j$ if the element $h_{ij}$ of H-matrix is a binary 1. For example, c-node $f_0$ is connected $c_0, c_1, c_2, c_3, c_5, c_7$ and $c_9$. The connection between $f_0$ and $c_0$ corresponds to $h_{00}$; the connection between $f_0$ and $c_2$ corresponds to $h_{01}$; and so on. Therefore, the connections to $f_0$ correspond to the first row in the H-matrix, further illustrated in Equation 2:

$$\overline{H}_0 = [1\ 1\ 1\ 1\ 0\ 1\ 0\ 1\ 0\ 1]. \quad \text{[Eqn. 2]}$$

A degree of a node is the number of edges (e.g., connections) connected to the node. A cycle is the total length, in Tanner graph 400, of a path of distinct edges that closes upon itself. A path from $c_1 \rightarrow f_2 \rightarrow c_7 \rightarrow f_0 \rightarrow c_1$ is an example of a short cycle. Short cycles should be avoided since short cycles adversely affect decoding performance. Short cycles manifest themselves in the H-matrix by columns with an overlap of two.

In some embodiments, LDPC CRISP 300 uses a sum-product process to decode the LDPC codes. In some such embodiments, a hard-decision decoding is performed. In other such embodiments, a soft-decision decoding is performed. In additional and alternative embodiments, LDPC CRISP 300 uses a min-sum process.

LDPC CRISP 300 is configured as a universal decoder for use with multiple transmission standards including, but not limited to, WiMax, DVB-S2 and 4G. The LDPC is configured to use a number of rate codes including, but not limited to: 1/2 rate code, 5/8 rate code, 3/4 rate code, and 13/16 rate code.

Figure 5A:
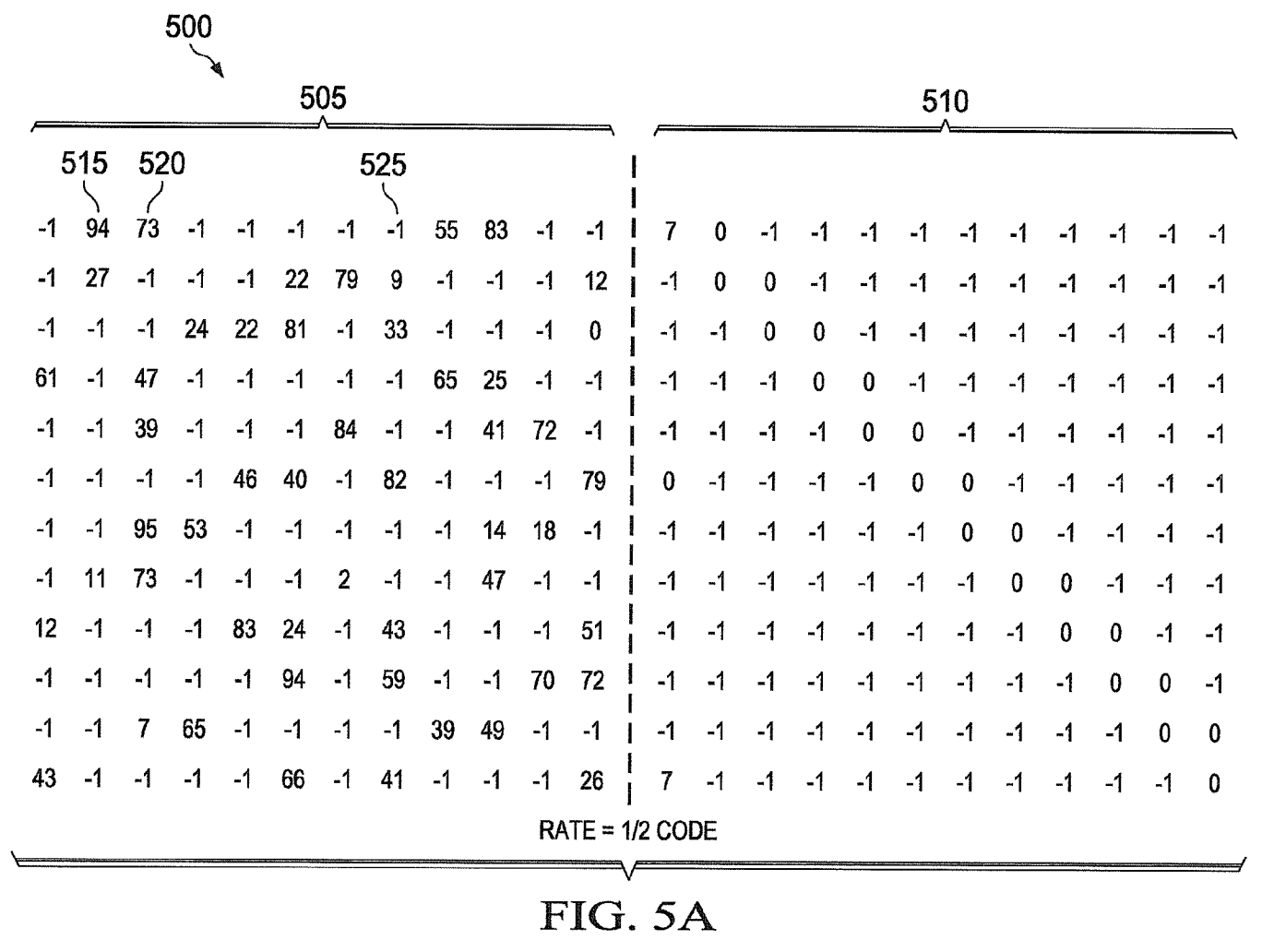

FIG. 5A illustrates rate 1/2 code 500 according to one embodiment of a conventional LDPC decoder. The embodiment of rate 1/2 code 500 shown in FIG. 5A is for illustration only. Other embodiments of rate 1/2 code 500 could be used without departing from the scope of this disclosure.

In some embodiments, the parity check H-matrix stored in a receive path, (e.g., stored in channel decoder and demodulator 280) may be configured according to rate 1/2 code 500. Rate 1/2 code 500 is a 576×288 matrix that represents a transmission of five hundred seventy-six (576) bits per frame (bpf). In rate 1/2 code 500, the first twelve (12) columns 505 represent systematic (or data) bits while the second twelve (12) columns 510 represent parity (or redundancy) bits. Each bit is a location bit that represents a 24×24 matrix. The Z-factor defines the number of bits per matrix. For example, the Z-Factor may be twenty-four (24). As such, in rate 1/2 code 500, each frame in the transmission includes two-hundred eighty-eight (288) systematic bits and two-hundred eighty-eight (288) parity bits. A −1 value represents a zero (0) matrix. Accordingly, a "−1" value indicates that the location is not used in the calculation. The remaining values (i.e., other than −1) are location values that represent a matrix. For example, the matrix represented by the location value 94, found in $h_{01}$ 515, is divided by four (4) and rounded-down to yield a twenty-three (23). Thereafter, the unity matrix is shifted twenty-three times.

FIG. 5B illustrates rate 5/6 code 550, according to one embodiment of a conventional LDPC decoder. The embodiment of rate 5/6 code 550 shown in FIG. 5B is for illustration only. Other embodiments of rate 5/6 code 550 could be used without departing from the scope of this disclosure.

In some embodiments, the parity check H-matrix may be configured according to rate 5/6 code 550. Rate 5/6 code 550 is a 576×288 matrix that represents a transmission of five hundred seventy-six (576) bpf. In rate 5/6 code 550, the first twenty (20) columns 555 represent systematic (data) bits, while the last four (4) columns 560 represent parity (redundancy) bits. As such, using rate 5/6 code 550, each frame in the transmission includes four-hundred eighty (480) bits of systematic bits and ninety-six (96) parity bits. A −1 value represents a zero (0) 24×24 matrix. Accordingly, a −1 value indicates that the bit is not used. The remaining values (other than −1) are location values that represent a matrix. For example, the matrix represented by the location value 25 found in $h_{01}$ 565 is divided by four (4) to and rounded down to yield a six (6). Thereafter, the unity matrix is shifted six times.

In some embodiments, a 4G H-matrix may comprise two vectors. In such embodiments, the first vector includes only the location values while the second vector includes a shift value. For example, the location vector for the first row of the H-Matrix 500 is illustrated by Equation 3:

$$H_0 = [1\ 2\ 8\ 9\ 12\ 13].\qquad\text{[Eqn. 3]}$$

Each value in the vector $H_0$ illustrated in Equation 3 represents a non-zero (e.g., not "−1") column position for row 0. Additionally, the second vector (referenced herein as $H_{s0}$), containing the shift values for the H-Matrix 500, is illustrated by Equation 4:

$$H_{s0} = \left[\frac{94}{4}\ \frac{73}{4}\ \frac{55}{4}\ \frac{83}{4}\ \frac{7}{4}\ \frac{0}{4}\right].\qquad\text{[Eqn. 4]}$$

Solving for the fractions, Equation 4 may be written as Equation 5:

$$H_{s0} = [23\ 18\ 13\ 20\ 1\ 0].\qquad\text{[Eqn. 5]}$$

Figure 6:
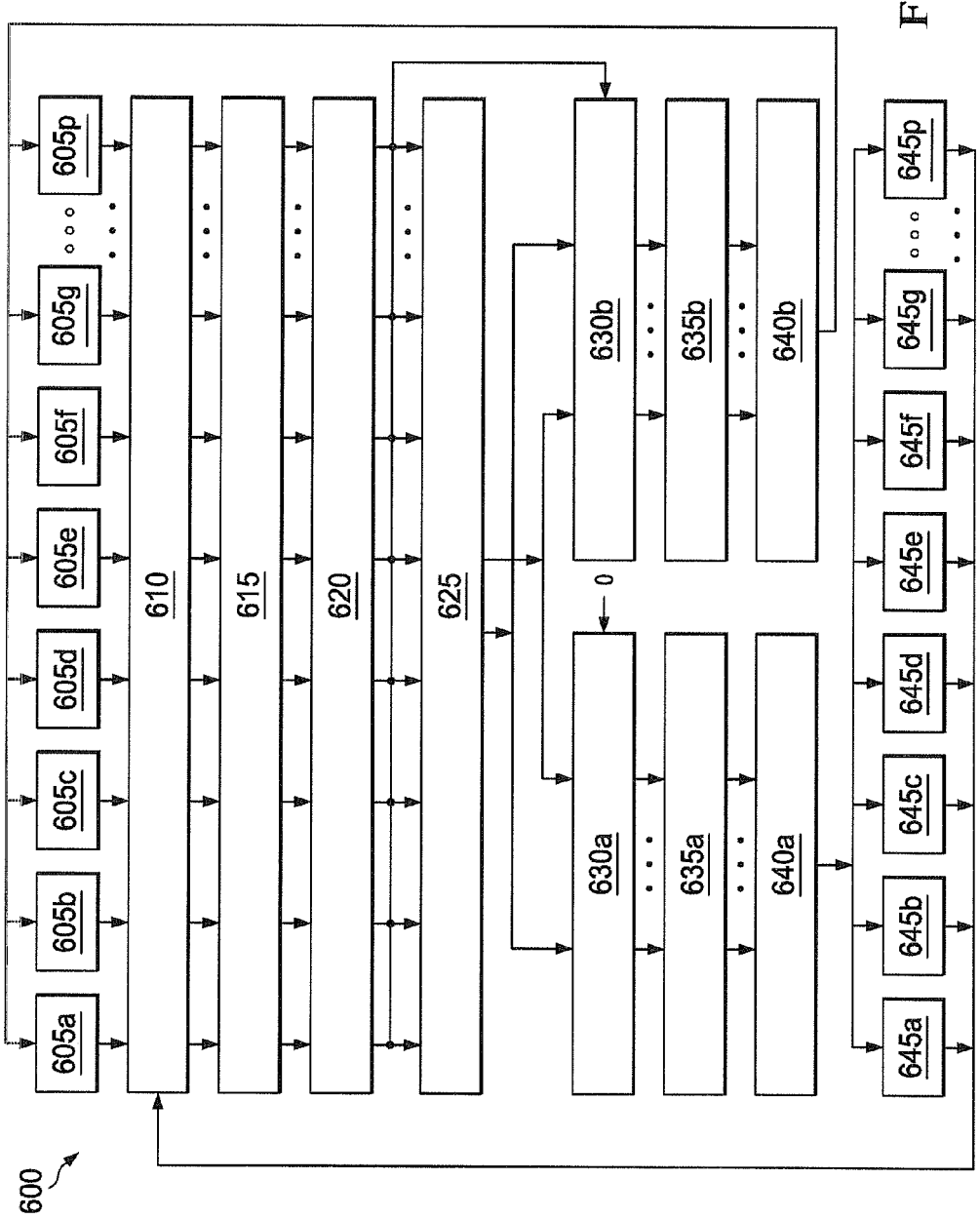
FIG. 6 illustrates a detailed block diagram of an exemplary LDPC decoder that performs decoding according to a flooding method.

FIG. 6 illustrates a detailed block diagram of an exemplary LDPC decoder CRISP 600 that performs decoding according to a flooding method. The embodiment of the serial-v LDPC CRISP 600 shown in FIG. 6 is for illustration only. Other embodiments of LDPC CRISP 600 could be used without departing from the scope of this disclosure. In FIG. 6, it shall be assumed that decoding operations are performed on N=672 total bits. Thus, for a Rate 1/2 decoding, there would be 336 systematic bits and 336 parity bits. For Z=42, the 336 systematic bits are segmented into 8 blocks of 42 data bits each and the 336 parity bits are segmented into 8 blocks of 42 parity bits each.

LDPC CRISP 600 includes an input buffer comprising a plurality of individual memory units 605. The individual memory units 605 are a plurality of separate and distinct memory devices that are each capable of receiving data to independent data write operations occurring the remaining individual memory units 605. In an exemplary embodiment, LDPC CRISP 600 includes sixteen (16) memory units 605a-605p. It will be understood that the illustration of 16 memory units merely is exemplary and the plurality of memory units 605 can include any number of memory units. The memory units 605a-p are configured to store data received via the receive path. As such, LDPC CRISP 600 is configured to read 16 data simultaneously (as opposed to only one data at a time if using only one memory unit).

For example, each memory unit 605 can receive data samples (e.g., 8 soft bits) from the receive path in FIG. 2E. In such example, when memory unit 605a receives data, memory unit 605a is receiving systematic data samples 0-41 at a time $t_0$. Similarly, memory unit 605b would receive data samples 42-83 at the time $t_0$, and so forth. Finally, memory unit 605p would receive data samples 629-671 at the time $t_0$. Therefore, memory units 605a-605p receive (336) samples of data (systematic or parity) simultaneously.

LDPC CRISP 600 also includes extrinsic/row subtractor block 610. The extrinsic/row subtractor block 610 is configured to remove at least a portion of extrinsic data stored in the memory banks by write switch 640. Extrinsic/row subtractor block 610 has 16 input channels, one for each of memory units 605a-605p, and 16 output channels.

LDPC CRISP 600 also includes a 1-to-1 read switch 615. Read switch 615 selects and aligns N variable inputs from the 16 input/extrinsic data per row. N corresponds to the number of processors elements (e.g., processors) operating in a processor array 625.

LDPC CRISP 600 includes Z-factor right shift MUX block 620. Z-factor right shift MUX block 620 is configured to apply a Z-factor right shift MUX operation to the received data read from the memory banks 605 (via blocks 610 and 615). After selecting the N inputs/extrinsic outputs, Z-factor right shift MUX block 620 aligns (i.e., Z-shifts) the N inputs/extrinsic outputs based on the H-matrix.

For example, the Z-factor shift is applied to the data in each memory unit 605 according to the H-matrix 500. In such example, since each location value corresponds to a 42×42 matrix (e.g., 42 samples of data), all 42 samples of data in each memory unit 605 are processed based on the location value found in the H-matrix. Therefore, all the data in memory units 605a-605p are shifted based on the H-matrix.

Minimum detection block 625 includes a number of processors configured to perform a flooding technique, sum products technique or min-sum technique. Minimum detection block 625 may include structures and functions similar to processor array 320 in FIG. 3. For example, minimum detection block 625 may be configured to find minimum values using a min-sum technique. Further, minimum detection block 625 is configured to perform decoding for any one or more of WiMax, DVB-S2 and 4G. Each of the processors in minimum detection block 625 is configured to apply a different equation as represented by the H-matrix. In some embodiments, the processor array comprises 16 processors. In some additional and alternative embodiments, minimum detection block 625 includes a single unit with 42 processors.

Each of the processor elements in minimum detection block 625 is configured to read from each of memory units 605a-605p such that all the data stored in one of memory units 605a-605p is processed using a different equation simultaneously.

Minimum detection block 625 is dependent upon the number of Z-factor columns processed per cycle. In some embodiments, minimum detection block 625 is configured to output a minimum (Min) value and a next minimum (Next Min) value corresponding to the smallest bit value and second smallest bit value respectively. Minimum detection block 625 stores the Min and Next Min values in one or more registers. The one or more registers are included in minimum detection block 625.

LDPC CRISP 600 includes a number of selection and sum blocks 630. In some embodiments, LDPC CRISP 600 includes a first selection and sum block 630a and a second selection and sum block 630b. Each of selection and sum blocks 630 is configured to perform a Min/Next Min selection and sum operation. In some embodiments, the first selection and sum block 630a is configured to perform the Min/Next Min selection and sum operation on a first check node while the second selection and sum block 630b is configured to perform the Min/Next Min selection and sum operation on a second check node.

LDPC CRISP 600 further includes a number of Z-factor left shift MUX blocks 635. In some embodiments, LDPC CRISP 600 includes a first Z-factor left shift MUX block 635a and a second Z-factor left shift MUX block 635b. Each of the number of Z-factor left shift MUX blocks 635a,b is configured to receive Min/Next Min selection and sums and apply a Z-factor left shift MUX operation to the received Min/Next Min selection and sums.

LDPC CRISP 600 is configured to generate a set of output data (e.g., extrinsic outputs). Each of a number of write switch blocks 640 is configured to write the output data of the Z-factor left shift MUX blocks 635 to at least one of a plurality of extrinsic memory units 645 and the plurality of memory banks 605. In some embodiments, a first write switch block 640a is configured to write the output data to the plurality of extrinsic memory units 645 while a second write switch block 640b is configured to write the output data to the plurality of memory units 605.

Figure 7:
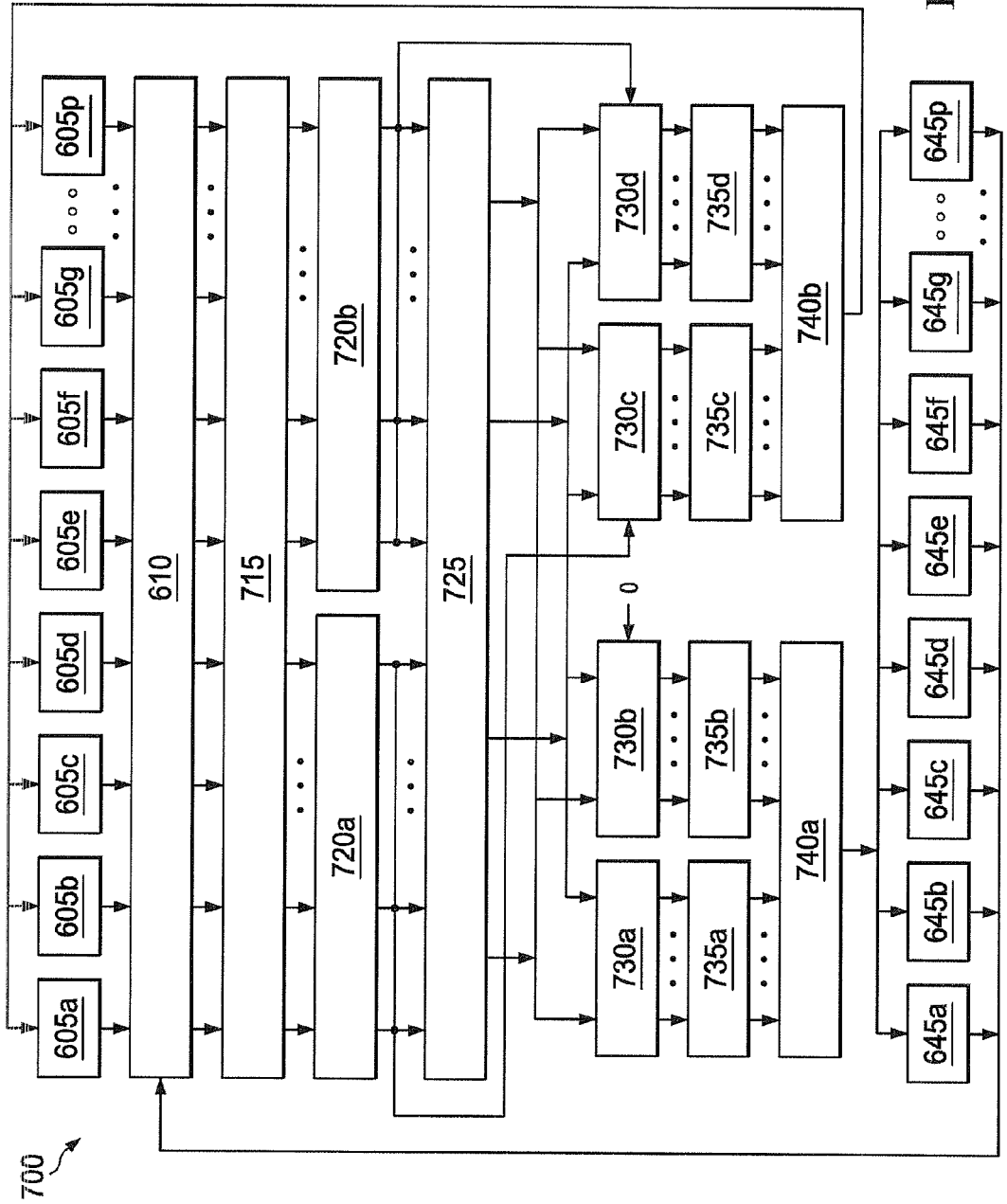
FIG. 7 illustrates a detailed block diagram of an exemplary LDPC decoder that performs layered decoding according to the principles of the present disclosure.

FIG. 7 illustrates a detailed block diagram of exemplary LDPC decoder CRISP 700, which performs layered decoding according to the principles of the present disclosure. Conventional layered decoding methods operate on one row of the H Matrix at a time. Decoded information from one row is used in the decoding of subsequent rows. However, the improved layered decoding method differs from conventional layered decoding methods in that two rows may be decoded simultaneously provided that column elements in the two selected rows of the matrix are mutually exclusive or non-overlapping (i.e., the elements from the same column are not used at the same time).

FIG. 8 may be used to illustrate this concept. FIG. 8 depicts an H Matrix for a rate 1/2 code. The first row of the H Matrix and the third row of the H Matrix are mutually exclusive or non-overlapping. It is recalled that a −1 entry in the H matrix indicates that the corresponding entry in the H matrix is not used in decoding the systematic and parity bits. For each column element in the first row of the H Matrix that is not −1, the corresponding column element in the third row of the H Matrix is −1 (not used). Similarly, for each column element in the third row of the H Matrix that is not −1, the corresponding column element in the first row of the H Matrix is −1 (not used).

More specifically, the first (=40), third (=38), fifth (=13), seventh (=5), and ninth (=18) column values of the first row all correspond to −1 values in the first, third, fifth, seventh, and ninth columns of the third row. Also, the second (=36), fourth (=31), sixth (=7), eighth (=34), tenth (=10), and eleventh (=41) column values of the third row all correspond to −1 values in the second, fourth, sixth, eighth, tenth, and eleventh columns of the first row.

It is this mutually exclusive (or non-overlapping) characteristic of the first and third rows to be decoded simultaneously, even in a layered decoding method. Similarly, the second and fourth rows of the H Matrix in FIG. 8 are mutually exclusive and may be decoded at the same time.

In FIG. 7, many of the component blocks of LDPC CRISP 700 are similar to LDPC CRISP 600 in FIG. 6. In particular, LDPC CRISP 700 includes an input buffer comprising a plurality of individual memory units 605a-605p, as in LDPC CRISP 600. LDPC CRISP 700 also includes extrinsic/row subtractor block 610, as in LDPC CRISP 600.

However, 1-to-1 read switch 615 is replaced in FIG. 7 by a 1×16-to-2×8 read switch 715. Read switch 715 receives the 16 input channels from subtractor block 610, but splits the outputs into two distinct 8 channel outputs—one for each of the mutually exclusive rows that are being processed at the same time.

Thereafter, the two distinct channels are processed in parallel. Z-factor right shift MUX block 720a performs a right shift on a first group of eight outputs (corresponding to one mutually exclusive matrix row) from subtractor block 715. Z-factor right shift MUX block 720b performs a right shift on a second group of eight outputs (corresponding to a second mutually exclusive matrix row) from subtractor block 715.

Minimum detection block 725 includes a number of processors configured to perform a layered decoding operation on one group of 8 output channels from MUX block 720a simultaneously with another group of 8 output channels from MUX block 720b. Unlike minimum detection block 625 (which generates a Min value and a Next Min value), minimum detection block 725 generates a pair of such values—namely, a Min value and a Next Min value for the outputs of MUX block 720a and a Min value and a Next Min value for the outputs of MUX block 720b. Based on the current H-Matrix rows processed, the Minimum detection block 725 can output either the two Min values (and two corresponding Next Min values) of the two sets of 8 inputs (for two mutually exclusive rows), or a single Min value (and the corresponding Next Min value) of the all 16 inputs (for a single row).

Selection and sum blocks 730a, 730b, 730c and 730d perform operations that are analogous to the operations performed by selection and sum blocks 630a and 730b. However, each of selection and sum blocks 730a-730d operates on 8 input channels and generates 8 output channels, whereas each of selection and sum blocks 630a and 630b operates on 16 input channels and generates 16 output channels.

Similarly, Z-factor left shift MUX blocks 735a, 735b, 735c and 750d perform operations that are analogous to the operations performed by Z-factor left shift MUX blocks 635a and 635b. However, each of MUX blocks 735a-750d operates on 8 input channels and generates 8 output channels, whereas MUX blocks 635a and 635b each operate on 16 input channels and generate 16 output channels.

Finally, LDPC CRISP 700 comprises write switch blocks 740a and 740b, which are 2×8-to-1×16 devices that reverse the operation of 1×16-to-2×8 read switch 715. Write switch block 740a writes output data to extrinsic memory units 645a-645p. Write switch block 740b writes the output data to memory units 605a-605p.

FIGS. 8-11 illustrate the comparative advantages of layered decoding according to the principles of the present disclosure.

FIG. 8 depicts an H Matrix for a rate 1/2 code. In an exemplary embodiment, LDPC decoder CRISP 700 comprises 16 processing elements, where each processing element processes 42 data or parity bits per cycle. For the rate 1/2 code in FIG. 8, there are 4 pairs of independent rows (i.e., mutually exclusive or non-overlapping) that can be processed independently (i.e., parallel machines for flooding). For a maximum for Wr=8 inputs per row, each machine can process 2 rows (8+8 processing elements) per cycle.

In layered operation, machine no. P0 processes the first and third rows in a first cycle (T=0). Machine no. P0 processes the second and fourth rows in a second cycle (T=1). Machine no. P0 processes the fifth and seventh rows in a third cycle (T=2). Finally, machine no. P0 processes the sixth and eighth rows in a fourth cycle (T=3).

In flooding operation, all in the same cycle, machine no. P0 processes the first and third rows, machine no. P1 processes the second and fourth rows, machine no. P2 processes the fifth and seventh rows, and machine no. P3 processes the sixth and eighth rows.

Thus, flooding is four times faster than layered, but requires four times as many processing elements. However, flooding decoding is 33-50% slower to converge than layered decoding. As a result, flooding decoding is about 33% less efficient than layered decoding.

FIG. 9 depicts an H Matrix for a rate 5/8 code. For the rate 5/8 code, there are 2 pairs of independent rows that can be processed independently and 2 dependent rows (i.e., 4 parallel machines for flooding). For the 2 pairs with maximum of Wr<=8 inputs per row, each machine can process 2 rows (8+8 processing elements) per cycle.

In layered operation, machine no. P0 processes the first in a first cycle (T=0). Machine no. P0 processes the second row in a second cycle (T=1). Machine no. P0 processes the third and fifth rows in a third cycle (T=2). Finally, machine no. P0 processes the fourth and sixth rows in a fourth cycle (T=3).

In flooding operation, all in the same cycle, machine no. P0 processes the first row, machine no. P1 processes the second row, machine no. P2 processes the third and fifth rows, and machine no. P3 processes the fourth and sixth rows. Thus, flooding is four times faster than layered, but requires four times as many processing elements.

Again, flooding is four times faster than layered, but requires four times as many processing elements. However, flooding decoding is 33-50% slower to converge than layered decoding. As a result, flooding decoding is about 33% less efficient than layered decoding.

FIG. 10 depicts an H Matrix for a rate 3/4 code. For the rate 3/4 code, there are 0 pairs of independent rows that can be processed independently and 4 dependent rows (i.e., 4 parallel machines for flooding).

In layered operation, machine no. P0 processes the first in a first cycle (T=0). Machine no. P0 processes the second row in a second cycle (T=1). Machine no. P0 processes the third row in a third cycle (T=2). Finally, machine no. P0 processes the fourth row in a fourth cycle (T=3).

In flooding operation, all in the same cycle, machine no. P0 processes the first row, machine no. P1 processes the second row, machine no. P2 processes the third row, and machine no. P3 processes the fourth row.

Thus, flooding is four times faster than layered, but requires four times as many processing elements. However, flooding decoding is 33-50% slower to converge than layered decoding. As a result, flooding decoding is about 33% less efficient than layered decoding.

FIG. 11 depicts an H Matrix for a rate 13/16 code. For the rate 13/16 code, there are 0 pairs of independent rows that can be processed independently and 3 dependent rows (i.e., minimum of 4 parallel machines for flooding to support the other rates above).

In layered operation, machine no. P0 processes the first in a first cycle (T=0). Machine no. P0 processes the second row in a second cycle (T=1). Machine no. P0 processes the third row in a third cycle (T=2).

In flooding operation, all in the same cycle, machine no. P0 processes the first row, machine no. P1 processes the second row, and machine no. P2 processes the third row.

Thus, flooding is three times faster than layered, but requires four times as many processing elements. However, flooding decoding is 33-50% slower to converge than layered decoding. As a result, flooding decoding is about 50% less efficient than layered decoding.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless communications device, a receiver comprising:
   receive path circuitry configured to receive and down-convert an incoming radio frequency (RF) signal to produce an encoded received signal; and
   a low-density parity check (LDPC) decoder associated with the receive path circuitry, the LDPC decoder configured to decode the encoded received signal, the LDPC decoder comprising:
      a memory configured to store a parity check H matrix comprising R rows and C columns, where each element of the parity check H matrix comprises one of a shift value or a non-use value indicating not to be used; and
      a plurality of processing elements configured to perform LDPC layered decoding, wherein at least one processing element is configured to process in a same cycle a first row and a second row of the parity check H matrix.

2. The receiver as set forth in claim 1, wherein elements of the first row and elements of the second row are mutually exclusive.

3. The receiver as set forth in claim 1, wherein for each element of the first row having a shift value, a corresponding element in a same column in the second row has a −1 value.

4. The receiver as set forth in claim 3, wherein for each element of the first row having a −1 value, a corresponding element in the same column in the second row has a shift value.

5. The receiver as set forth in claim 1, wherein the parity check H matrix is associated with a rate 1/2 code.

6. The receiver as set forth in claim 1, wherein the parity check H matrix is associated with a rate 5/8 code.

7. For use in a wireless communications device, a method of decoding comprising:

in a receiving device, receiving and down-converting an incoming radio frequency (RF) signal to produce an encoded received signal; and decoding the encoded received signal in a low-density parity check (LDPC) decoder, the LDPC decoder comprising a memory configured to store a parity check H matrix comprising R rows and C columns, where each element of the parity check H matrix comprises one of a shift value or a non-use value indicating not to be used; and in a processing element of the decoder configured to perform LDPC layered decoding, processing in a same cycle a first row and a second row of the parity check H matrix.

8. The method as set forth in claim 7, wherein elements of the first row and elements of the second row are mutually exclusive.

9. The method as set forth in claim 7, wherein for each element of the first row having a shift value, a corresponding element in a same column in the second row has a −1 value.

10. The method as set forth in claim 9, wherein for each element of the first row having a −1 value, a corresponding element in the same column in the second row has a shift value.

11. The method as set forth in claim 7, wherein the parity check H matrix is associated with a rate 1/2 code.

12. The method as set forth in claim 7, wherein the parity check H matrix is associated with a rate 5/8 code.

13. For use in a wireless network, a mobile station capable of communicating with at least one base station of the wireless network, the mobile station comprising:

receive path circuitry configured to receive and down-convert an incoming radio frequency (RF) signal transmitted by the at least one base station to produce an encoded received signal; and a low-density parity check (LDPC) decoder associated with the receive path circuitry, the LDPC decoder configured to decode the encoded received signal, the LDPC decoder comprising:

a memory configured to store a parity check H matrix comprising R rows and C columns, where each element of the parity check H matrix comprises one of a shift value or a non-use value; and a plurality of processing elements configured to perform LDPC layered decoding, wherein at least one processing element is configured to process in a same cycle a first row and a second row of the parity check H matrix.

14. The mobile station as set forth in claim 13, wherein elements of the first row and elements of the second row are mutually exclusive.

15. The mobile station as set forth in claim 13, wherein for each element of the first row having a shift value, a corresponding element in a same column in the second row has a −1 value.

16. The mobile station as set forth in claim 15, wherein for each element of the first row having a −1 value, a corresponding element in the same column in the second row has a shift value.

17. The mobile station as set forth in claim 13, wherein the parity check H matrix is associated with a rate 1/2 code.

18. The mobile station as set forth in claim 13, wherein the parity check H matrix is associated with a rate 5/8 code.

19. The mobile station as set forth in claim 13, wherein the receive path comprises an orthogonal frequency division multiple access (OFDMA) receive path.

20. The mobile station as set forth in claim 13, wherein the mobile station operates according to the 1.0 WiGig specification.

* * * * *